(12) United States Patent
Hwang

(10) Patent No.: US 7,656,008 B2
(45) Date of Patent: Feb. 2, 2010

(54) SEMICONDUCTOR DEVICES AND METHODS OF FORMING THE SAME

(75) Inventor: Sun-Ha Hwang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 141 days.

(21) Appl. No.: 11/968,234

(22) Filed: Jan. 2, 2008

(65) Prior Publication Data

US 2008/0169515 A1 Jul. 17, 2008

(30) Foreign Application Priority Data

Jan. 12, 2007 (KR) .................. 10-2007-0003842

(51) Int. Cl.
*H01L 29/8605* (2006.01)
(52) U.S. Cl. .................. 257/536; 257/379; 438/238
(58) Field of Classification Search ............ 257/379, 257/536, E27.016; 438/238
See application file for complete search history.

(56) References Cited

U.S. PATENT DOCUMENTS

| | | | |
|---|---|---|---|
| 6,177,346 B1 * | 1/2001 | Manning | .................... 438/656 |
| 6,399,987 B2 | 6/2002 | Kim | |
| 6,838,737 B2 | 1/2005 | Kim et al. | |
| 2004/0026762 A1 * | 2/2004 | Hirano et al. | ............... 257/536 |

FOREIGN PATENT DOCUMENTS

| | | |
|---|---|---|
| JP | 2000-156494 | 6/2000 |
| KR | 2001-0077099 A | 8/2001 |
| KR | 2002-0083575 A | 11/2002 |
| KR | 10-0447030 B1 | 2/2004 |
| KR | 10-0587045 B1 | 5/2006 |
| KR | 10-2006-0066963 A | 6/2006 |

* cited by examiner

*Primary Examiner*—Leonardo Andújar
*Assistant Examiner*—Jordan Klein
(74) *Attorney, Agent, or Firm*—Myers Bigel Sibley & Sajovec, P.A.

(57) ABSTRACT

Semiconductor devices are disclose that include a first doped region and a second doped region spaced apart from each other and defined within a same well of a semiconductor substrate. A gate insulating layer and a gate electrode are stacked on a channel region between the first and second doped regions. Spacers are on opposite sidewalls of gate electrode. A first surface metal silicide layer extends across a top surface of the first doped region adjacent to the spacer. A second surface metal silicide layer extends across a top surface of the second doped region adjacent to the spacer. At least one insulation layer extends across the semiconductor substrate including the first and second surface metal silicide layers. A first contact plug extends through the insulation layer and contacts the first surface metal silicide layer. A second contact plug extends through the insulation layer, the second surface metal silicide layer, and the second doped region into the well within the semiconductor substrate. Related methods of forming semiconductor devices are disclosed.

11 Claims, 9 Drawing Sheets

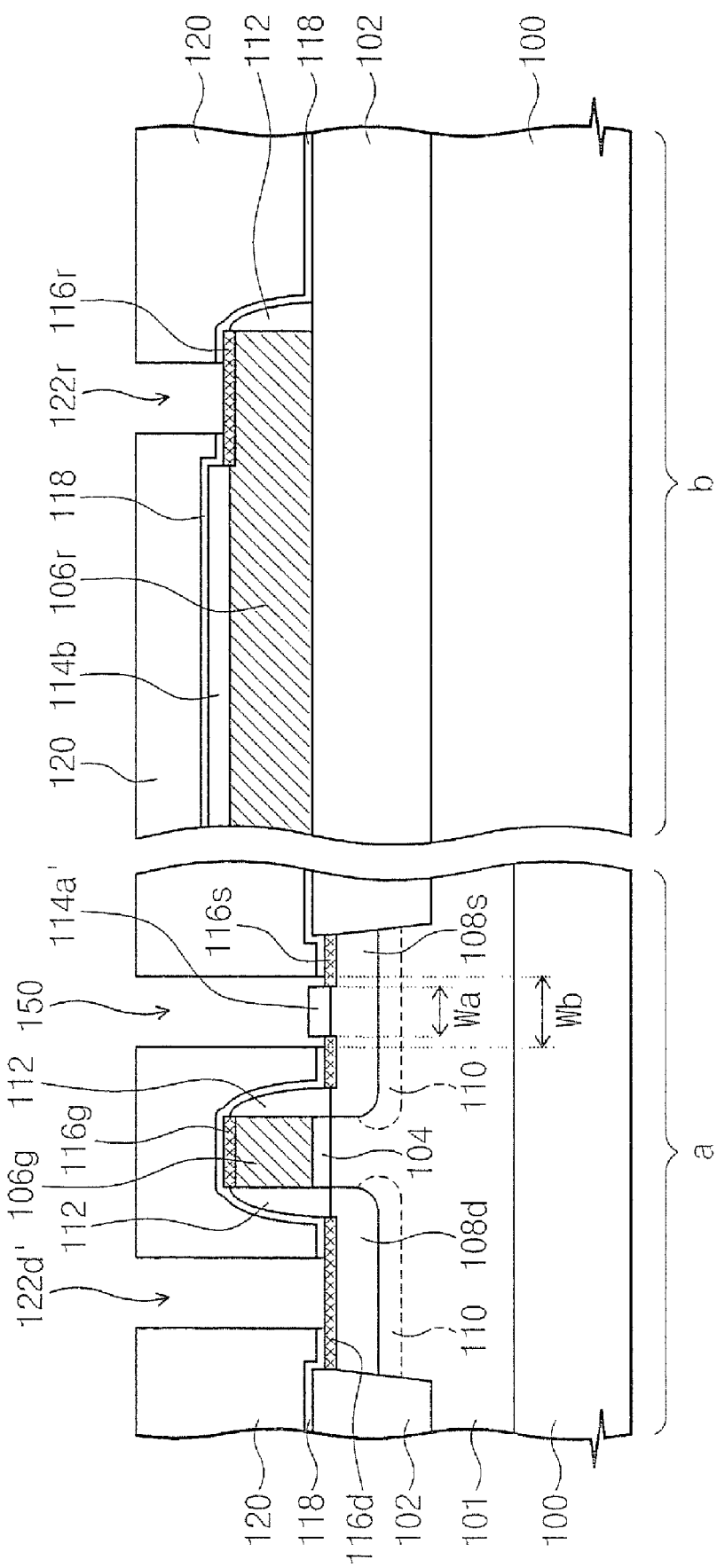

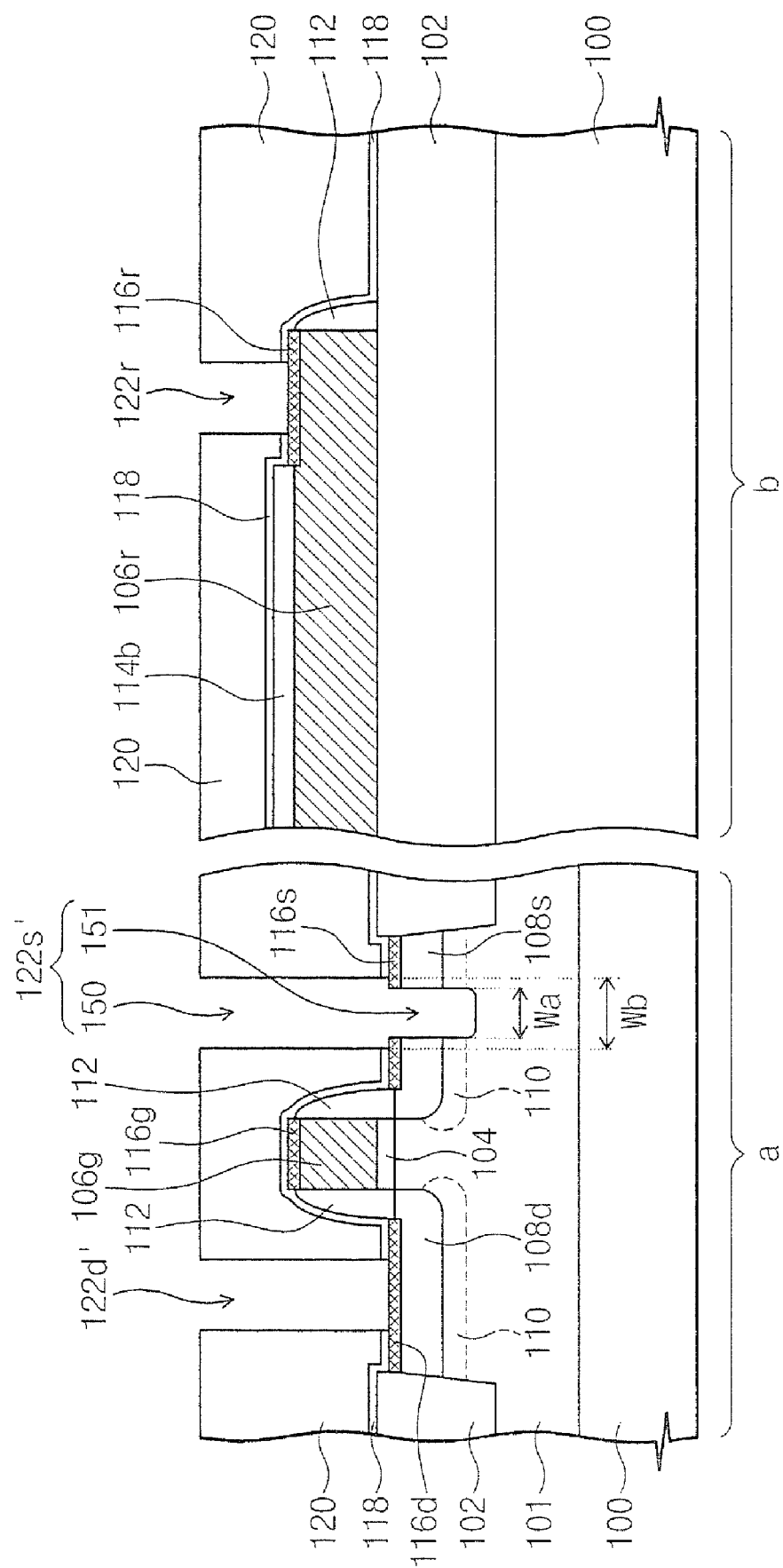

US 7,656,008 B2

SEMICONDUCTOR DEVICES AND METHODS OF FORMING THE SAME

CROSS-REFERENCE TO RELATED APPLICATION

This U.S. non-provisional patent application claims priority under 35 U.S.C. § 119 of Korean Patent Application No. 10-2007-0003842, filed on Jan. 12, 2007, the entire contents of which are hereby incorporated by reference.

BACKGROUND OF THE INVENTION

The present invention relates to semiconductor devices and fabrication of semiconductor devices, and more particularly, to semiconductor devices with transistors and related fabrication techniques.

A transistor can be formed on a semiconductor substrate to include a source region and a drain region defined in a well within the semiconductor substrate, and a gate electrode on a channel region between the source and drain regions. During operation, a well bias can be applied to the well, to increase the operational stability of the transistor. As integration densities increase, semiconductor device features continue to decrease and, consequently, the size of well pick up regions that can be used to apply well bias also continue to decrease.

FIG. 1 is a sectional view of conventional transistors with a structure that can be used to apply well bias. Referring to FIG. 1, a well 2 is formed in a semiconductor substrate 1, and a device isolating layer 3 is formed on the semiconductor substrate 1 to define active regions. A gate oxide layer 4 and a gate electrode 5 are sequentially formed on the active region. Dopant ions are implanted into the active regions adjacent to both sides of the gate electrode 5 to form source/drain regions 6. The source/drain regions 6 are formed in the well 2 and are doped with different type dopants from that in the well 2. A transistor is formed from a gate electrode 5 and associated source/drain regions 6. As shown in FIG. 1, a plurality of transistors are formed on the well 2.

A single well pick up region 7 is formed in the well 2. The single well pickup region 7 is shared by the plurality of transistors shown in FIG. 1. A well bias voltage is applied through the well pick up region 7 to the well 2 below the plurality of transistors.

One potential drawback of this structure is that although a sufficient level of well bias may be applied to a portion of the well 2 that is below the transistor immediately adjacent to the well pick up region 7 (e.g., leftmost side of the FIG. 1), an insufficient level of well bias may be applied to a portion of the well 2 that is below the transistor further from the well pick up region 7 (e.g., rightmost side of the FIG. 1). More particularly, as the distance between a portion of the well 2 that is below a transistor and the well pick up region 7 increases, the cumulative resistance between that portion of the well 2 and the well pick up region 7 correspondingly increases. As a result, the well voltage below transistors which are spaced relatively far from the well pick up region 7 can become insufficient to maintain stable operation of those transistors, and can result in latch-up and/or deterioration in noise margin for those transistors.

SUMMARY

Some embodiments of the present invention are directed to a semiconductor device that includes a first doped region and a second doped region spaced apart from each other and defined within a same well of a semiconductor substrate. A gate insulating layer and a gate electrode are stacked on a channel region between the first and second doped regions. Spacers are on opposite sidewalls of the gate electrode. A first surface metal silicide layer extends across a top surface of the first doped region adjacent to the spacer. A second surface metal silicide layer extends across a top surface of the second doped region adjacent to the spacer. At least one insulation layer extends across the semiconductor substrate including the first and second surface metal silicide layers. A first contact plug extends through the insulation layer and contacts the first surface metal silicide layer. A second contact plug extends through the insulation layer, the second surface metal silicide layer, and the second doped region into the well within the semiconductor substrate.

The second contact plug can be used to apply a bias voltage to the well, which may improve operational stability and/or integration density of the semiconductor device.

In some further embodiments, a silicide preventing pattern is on the semiconductor substrate and separates the second contact plug from the second surface metal silicide layer.

In some further embodiments, the second contact plug includes a first portion that extends through the insulation layer, and a second portion that extends through the second doped region. The first portion of the second contact plug is wider than the second portion of the second contact plug.

In some further embodiments, a pair of pocket doped regions are defined in the well respectively below the first and second doped regions. The pocket doped regions have a higher dopant concentration of the same type of dopant as that doped in the well. The second contact plug extends at least partially into the pocket doped region below the second doped region.

In some further embodiments, the well is doped with a p-type dopant and the first and second doped regions are doped with an n-type dopant. During operation, the semiconductor device is configured to apply a ground voltage to the well and to the second doped region through the second contact plug.

In some further embodiments, the well is doped with an n-type dopant and the first and second doped regions are doped with a p-type dopant. During operation, the semiconductor device is configured to apply a power voltage to the well and to the second doped region through the second contact plug.

In some further embodiments, a gate metal silicide is on the gate electrode, and a gate metal silicide in the first and second surface metal silicide layer is included the same metal.

In some further embodiments, the semiconductor substrate includes a transistor region and a resistance region, and the well, the first doped region, the second doped region, and the gate electrode are disposed in the transistor region. A resistance pattern is on the semiconductor substrate in the resistance region. A resistance silicide preventing pattern is on a first portion of a top surface of the resistance pattern. The resistance metal silicide layer is on a second portion of the top surface of the resistance pattern and not on the first portion of the top surface of the resistance region. The resistance plug extends through the insulation layer to contact the resistance metal silicide layer. The resistance metal silicide layer and the first and second surface metal silicide layers may include the same metal. The resistance plug and the first and second contact plugs may include the same material.

In some further embodiments, a first interconnection is on the insulation layer and contacts the first contact plug. A second interconnection is on the insulation layer and contacts the second contact plug. A resistance interconnection is on the insulation layer and contacts the resistance plug.

Some other embodiments of the present invention are directed to methods of forming a semiconductor device. A well is formed on a semiconductor substrate. A gate insulating layer and a gate electrode are sequentially formed on the semiconductor substrate. First and second doped regions are formed in the well on opposite sides of gate electrode. Spacers are formed on opposite sidewalls of a gate electrode. A silicide preventing pattern is formed on a portion of the second doped region while leaving exposed another portion of the second doped region. A silicidation process is performed to form a first surface metal silicide layer on the first doped region, and to form a second surface metal silicide layer on the exposed portion of the second doped region and not on the other portion of the second doped region covered by the silicide preventing pattern. At least one insulation layer is formed on the semiconductor substrate. A first contact hole and a second contact hole are formed, with the first contact hole extending through the insulating layer to expose the first surface metal silicide layer, and with the second contact hole extending through the insulating layer and the second doped region and into the well. First and second contact plugs are formed that fill at least a majority of the first and second contact holes, respectively.

In some further embodiments, the second contact hole extends through the insulation layer, the silicide preventing pattern, and the second doped region. The silicide preventing pattern surrounds the second hole.

In some further embodiments, an upper portion of the second contact hole extends through the insulation layer. A lower portion of the second contact hole extends through the second doped region. The upper portion of the second contact hole is wider than the lower portion of the second contact hole. Formation of the second contact hole removes the silicide preventing pattern from over the second doped region.

In some further embodiments, a pair of pocket doped regions are formed in the well respectively below the first and second doped regions. The pocket doped regions have a higher dopant concentration of the same type of dopant as is doped in the well, and the second contact plug is formed to extend at least partially into the pocket doped region below the second doped region.

In some further embodiments, the well is doped with a p-type dopant and the first and second doped regions are doped with an n-type dopant. During operation of the semiconductor device, a ground voltage is applied to the well and to the second doped region through the second contact plug.

In some further embodiments, the well is doped with an n-type dopant and the first and second doped regions are doped with a p-type dopant. During operation of the semiconductor device, a power voltage is applied to the well and to the second doped region through the second contact plug.

In some further embodiments, the semiconductor substrate includes a transistor region and a resistance region, and the well, the first doped region, the second doped region, and the gate electrode are formed in the transistor region. A resistance pattern is formed on the semiconductor substrate in the resistance region. A resistance silicide preventing pattern is formed on a first portion of a top surface of the resistance pattern. A resistance metal silicide is formed on a second portion of the top surface of the resistance pattern and not on the first portion of the top surface of the resistance region. A resistance contact hole is formed that extends through the insulation layer to expose the resistance metal silicide. A resistance plug is formed that fills the resistance contact hole.

In some further embodiments, the resistance pattern and the gate electrode are simultaneously formed. The resistance silicide preventing pattern and the silicide preventing pattern are simultaneously formed. The resistance metal silicide and the first and second surface metal silicides are simultaneously formed. The resistance plug and the first and second contact plugs are simultaneously formed.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIGS. 8 and 9 are sectional views illustrating methods of forming the exemplary semiconductor device of FIG. 7 according to some embodiments of the present invention.

DETAILED DESCRIPTION OF EMBODIMENTS

Figure 1:
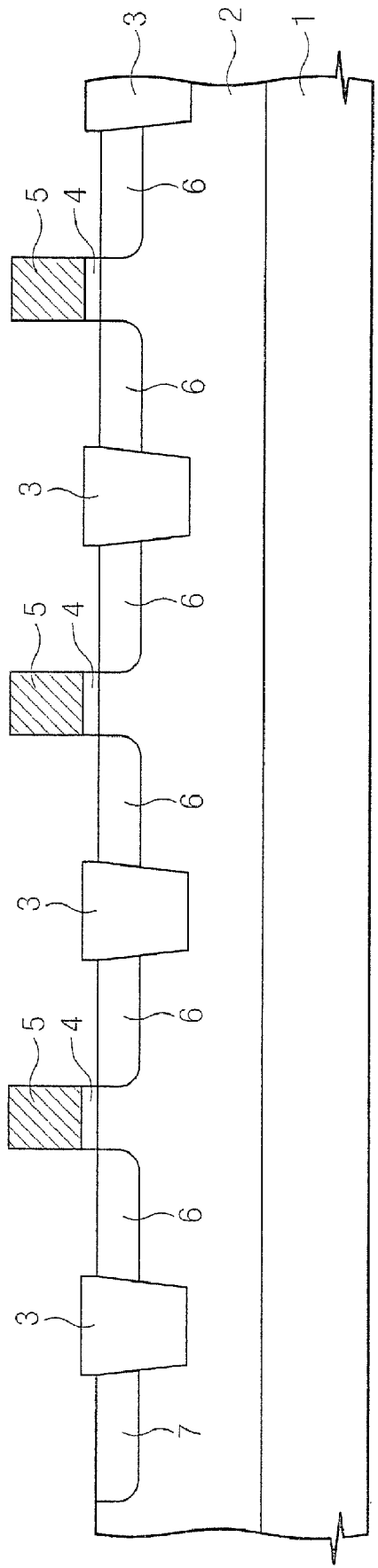
FIG. 1 is a sectional view illustrating a conventional semiconductor device with a plurality of transistors.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
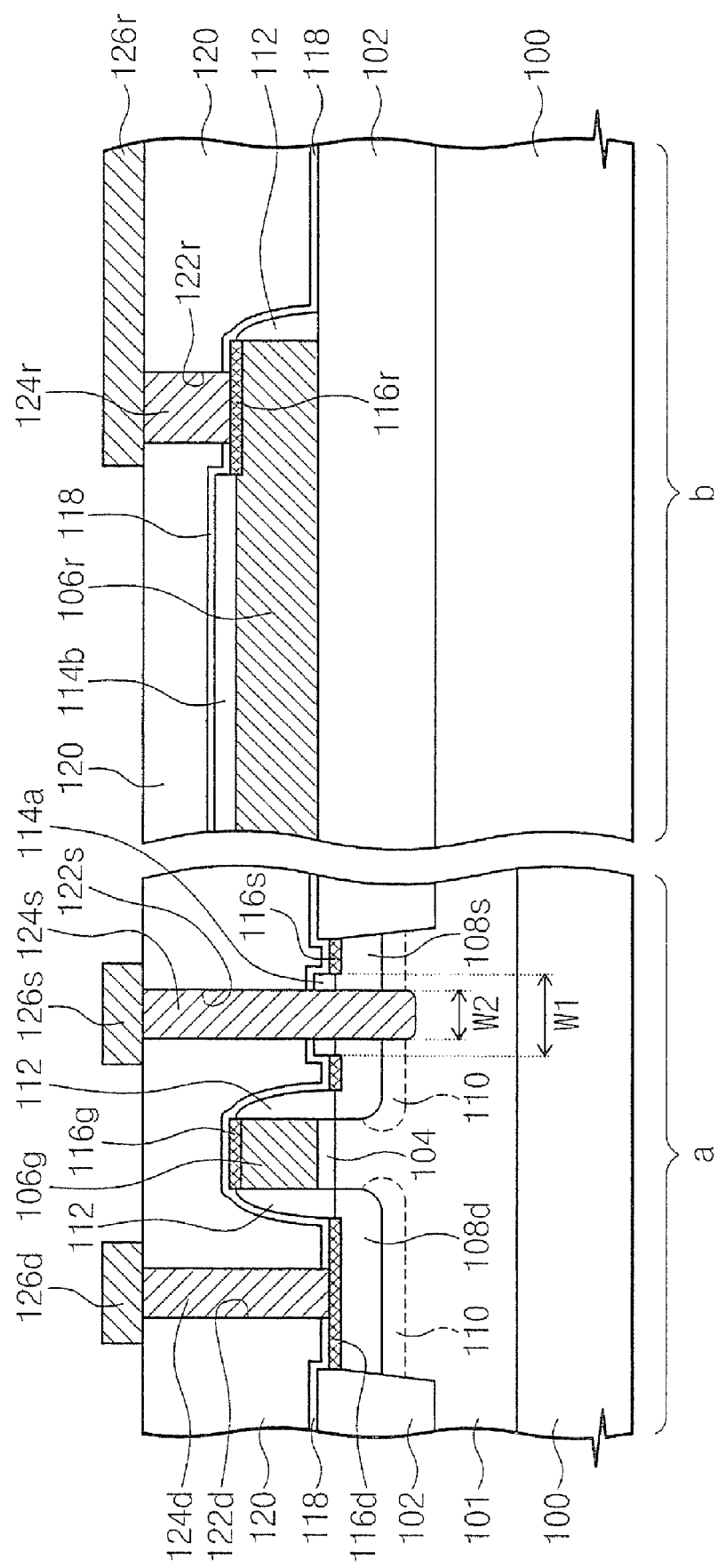
FIG. 2 is a sectional view of a semiconductor device configured according to some embodiments of the present invention.

FIG. 2 is a sectional view of a semiconductor device according to some embodiments of the present invention.

Referring to FIG. 2, a transistor region "a" and a spaced apart resistance region "b" are defined in the semiconductor substrate 100. A well 101 doped with first conductive type dopants is formed in the transistor region "a" of the semiconductor substrate 100. A device isolating layer 102 is disposed adjacent to the well 101 to define an active region. The active region is formed as a portion of the semiconductor substrate 100 having the well 101 surrounded by the device isolating layer 102. The bottom of the well 101 may extend deeper into the semiconductor substrate 100 than a bottom of the device isolating layer 102. The device isolating layer 102 is also formed in the resistance region "b" of the semiconductor substrate 100. The device isolating layer 102 in the resistance region "b" may be formed on the entire resistance region "b".

A gate insulating layer 104 and a gate electrode 106g are sequentially stacked on the active region. The gate electrode 106g crosses over the active region. The gate insulating layer 104 may be formed of an oxide layer (e.g., a thermal oxide layer). Alternatively, the gate insulating layer 104 may include an insulating material with a high dielectric constant such as metal silicate and/or insulating metal oxide. The gate electrode 106g may be formed of doped polysilicon. A resistance pattern 106r is disposed on the device isolating layer 102 of the resistance region "b". The resistance pattern 106r may be formed of a material that is easily adjusted to regulate resistivity. For example, the resistance pattern 106r may be formed of polysilicon, so that the resistivity of the resistance pattern 106r can be regulated by controlling an amount of dopant therein. The gate electrode 106g and the resistance pattern 106r may be doped with the same type dopant. Alternatively, the gate electrode 106g and the resistance pattern 106r may be doped with different types of dopants from each other.

A first doped region 108d and a second doped region 108s, both doped with dopants, are formed in the active regions on opposite sides of the gate electrode 106g. The first doped region 108d can correspond to a drain region 108d and the second doped region 108s can correspond to a source region 108s. Hereinafter, the first doped region 108d is referred to as the drain region 108d and the second doped region 108s is referred to as the source region 108s for convenience of description. The drain and source regions 108d and 108s may be doped with second conductive type dopant, which is different from dopants in the well 101.

Pocket doped regions 110 are disposed in the wells 101 below the drain and source regions 108d and 108s, respectively. The pocket doped region 110 may cover lower sidewalls of the drain and source regions 108d and 108s adjacent to a channel region below the gate electrode 116g. The pocket dopant region 110 may be doped with the same type of dopants as doped in the well 101. The dopant concentration of the pocket doped region 110 may be greater than that of the well 101, which may enhance punch-through properties between the source region 108s and the drain region 108d. Spacers 112 are disposed on both sidewalls of the gate electrode 106g, and may be disposed on a sidewall of the resistance pattern 106r. The spacers 112 may be formed from an insulating material, including, but not limited to, an oxide, a nitride, and/or an oxide nitride.

A first surface metal silicide 116d is disposed on the entire top surface of the drain region 108d adjacent to the spacer 112. A source silicide preventing pattern 114a is disposed on the top surface of the source region 108s. At this point, the source silicide preventing pattern 114a may be disposed on a portion of the top surface of the source region 108s. Accordingly, the top surface of the source region 108s may be divided into a portion covered by the source silicide preventing pattern 114a and a portion not covered by the source silicide preventing pattern 114a. A second surface metal silicide 116s is disposed on the portion of the source region 108s but is not covered by the source silicide preventing pattern 114a. A gate metal silicide 116g is disposed on the gate electrode 106g.

A resistance silicide preventing pattern 114b on the resistance pattern 106r. At this point, the top surfaces on both ends of the resistance pattern 106r may not be covered by the resistance silicide preventing pattern 114b. The top surfaces on both ends of the resistance pattern 106r form contact regions. A resistance metal silicide 116r is disposed on the top surfaces (i.e., a portion that is not covered by the resistance silicide preventing pattern 114b) on both ends of the resistance pattern 106r. Only one end of the resistance pattern 106r is illustrated in FIG. 1.

The source and resistance silicide preventing patterns 114a and 114b are formed from an insulating material that inhibits/prevents formation of silicide. The source and resistance silicide preventing patterns 114a and 114b may be formed of the same material, such as a nitride layer. Furthermore, the source and resistance silicide preventing patterns 114a and 114b may include a sequentially-stacked oxide layer and nitride layer. The first and second surface metal silicides 116d and 116s can include the same metal. The first and second surface metal silicides 116d and 116s may have a sufficient etch selectivity with respect to the semiconductor substrate 100. The first and second surface metal silicides 116d and 116s may be formed of cobalt silicide, which has a sufficient etch selectivity with respect to the semiconductor substrate 100. Alternatively, the first and second surface metal silicides 116d and 116s may be formed of another metal silicide. The first and second surface metal silicides 116d and 116s and the gate metal silicide 116g may include the same metal. The resistance metal silicide 116r may include the same metal as that of the first and second surface metal silicides 116d and 116s.

An etch stop layer 118 covers the entire top surface of the semiconductor substrate 100, including the metal silicides 116d, 116s, 116g, and 116r, and the spacer 112. An interlayer dielectric 120 covers the entire surface of the etch stop layer 118. The etch stop layer 118 is formed of an insulating layer having an etch selectivity with respect to the interlayer dielectric 120. For example, the interlayer dielectric 120 can be formed of an oxide layer, and the etch stop layer 118 can be formed of an oxide nitride layer. The etch stop layer 118 can be omitted pursuant to design considerations.

A first contact plug 124d fills a first contact hole 122d. The first contact hole 122d successively passes through the interlayer dielectric 120 and the etch stop layer 118 to expose the first surface metal silicide 116d. That is, the first contact plug 124d successively passes through the interlayer dielectric 120 and the etch stop layer 118 to contact the first surface metal silicide 116d.

A second contact plug 124s fills a second contact hole 122s that passes through the interlayer dielectric 120, the etch stop layer 118, the source silicide preventing pattern 114a, and the source region 108s below the source silicide preventing pattern 114a. The second contact hole 122s exposes the source region 108s and the pocket doped region 110 below the source region 108s. Furthermore, the second contact hole 122s may expose the well 101 below the pocket doped region 110. That is, the second contact plug 124s successively passes through the interlayer dielectric 120, the etch stop layer 118, the source silicide preventing pattern 114a, and the source region 108s to contact the well 101. The second contact plug 124s therefore contacts the source region 108s. The second contact plug 124s passes through the pocket doped region 110 having a relatively high concentration to contact the well 101. The pocket doped region 110 may enhance punch-through properties between the drain and source regions 108d and 108s, and may reduce contact resistance between the second contact plug 124s and the well 101.

The source silicide preventing pattern 114a has a first width W1 in a channel length direction of the channel region and the second contact plug 124s has a second width W2 in the channel length direction. The second width W2 of the second contact plug 124s is less than the first width W1 of the source silicide preventing pattern 114a. The source silicide preventing pattern 114a may surround a sidewall of a middle portion at the second contact plug 124s. The second contact plug 124s is spaced apart (separated) from the second surface metal silicide 116s by the source silicide preventing pattern 114a. The channel length direction of the first contact plug 124d may have the same width as the second width W2 of the second contact plug 124s. Alternatively, the width of the first contact plug 124d may be different from the second width W2 of the second contact plug 124s.

A resistance plug 124r passes successively through the interlayer dielectric 120 and the etch stop layer 118 to fill a resistance contact hole 122r that exposes the resistance metal silicide 116r. Therefore, the resistance plug 124r contacts the resistance metal silicide 116r. A width in the channel length direction of the resistance plug 124r may be different from the second width W2 of the second contact plug 124s. Alternatively, the width of the resistance plug 124r can be identical to the second width W2 of the second contact plug 124s.

The first and second contact plugs 124d and 124s may be formed from the same conductive material, and may be formed from the same material as the resistance plug 124r. The plugs 124d, 124s, and 124r may include a doped polysilicon, tungsten, copper, and/or aluminum. In particular, the plugs 124d, 124s, and 124r may be formed from a material providing an ohmic-contact between the second contact plug 124s and the semiconductor substrate 100 having the source region 108s, the well 101, and the pocket doped region 110. For example, the second contact plug 124s can be formed from doped polysilicon or titanium silicide.

First and second interconnections 126d and 126s are disposed on the interlayer dielectric 120 of the transistors region "a", and a resistance interconnection 126r is disposed on the interlayer dielectric 120 of the resistance region "b". The first and second interconnections 126d and 126s respectively contact the first contact plug 124d and the second contact plug 124s. The resistance interconnection 126r contacts the resistance plug 124r. The first, second, and resistance interconnections 126d, 126s, and 126r can be formed from a metal, such as tungsten.

Accordingly, the second contact plug 124s directly contacts the source region 108s and the well 101 below the source region 108s. The transistor having the gate electrode 106g and the drain and source regions 108d and 108s can directly apply bias to the source region 108s and to the well 101 below the source region 108d through the second contact plug 124s. Consequently, the transistor may operate more reliably and without requiring use of a conventional well pick-up region to apply well bias, and, may thereby enable fabrication of more highly integrated semiconductor devices.

The transistor having the drain and source regions 108d and 108s and the gate electrode 106g may be an NMOS transistor or a PMOS transistor.

When the transistor is a NMOS transistor, the well 101 is doped with a p-type dopant, and the drain and the source regions 108d and 108s are doped with an n-type dopant. When operating, the semiconductor device is configure to apply a ground voltage to the source region 108s and to the well 101 through the second interconnection 126s and the second contact plug 124s.

In contrast, when the transistor is a PMOS transistor, the well 101 is doped with an n-type dopant, and the drain and source regions 108d and 108s are doped with a p-type dopant. When operating, the semiconductor device is configured to apply a power voltage to the source region 108s and to the well 101 through the second interconnection 126s and the second contact plug 124s.

The semiconductor device of the present invention may include the MOS transistor or the PMOS transistor.

FIGS. 3 through 6 are sectional views illustrating methods of forming a semiconductor device, such as the semiconductor device of FIG. 2, according to some embodiments of the present invention.

Figure 3:
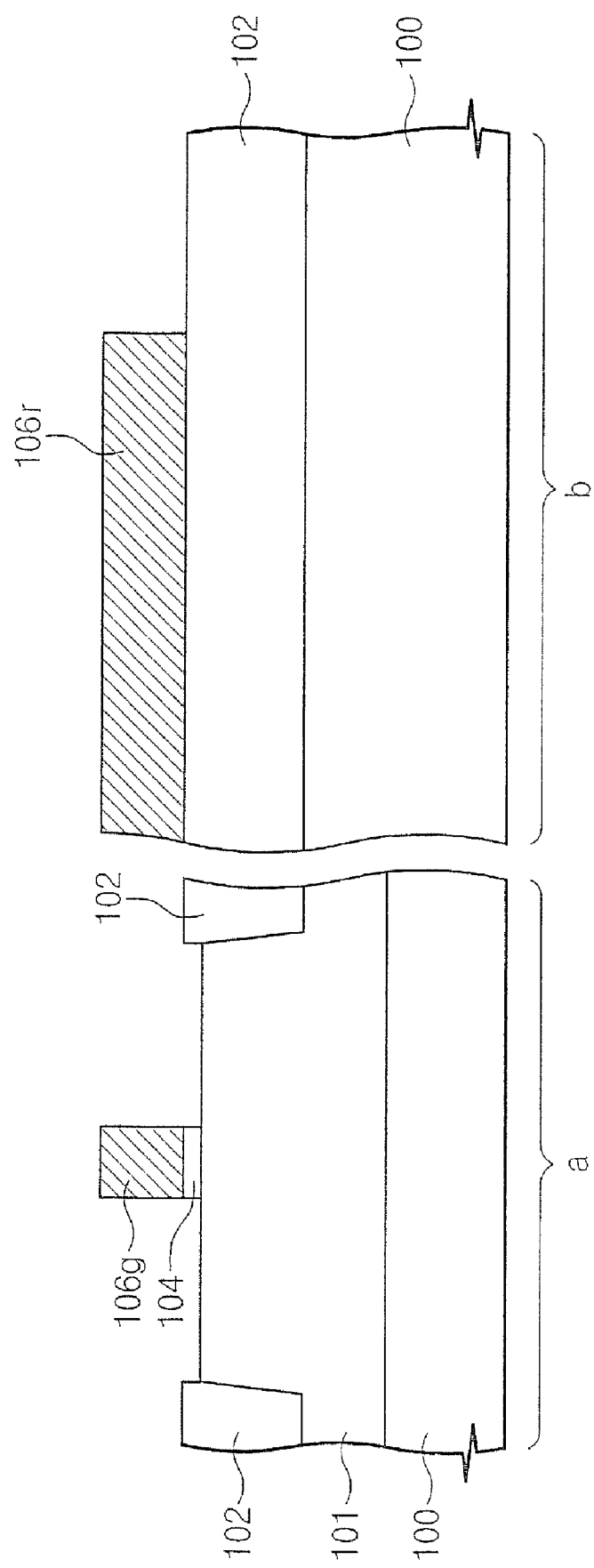
FIGS. 3 through 6 are sectional views illustrating methods of forming the exemplary semiconductor device of FIG. 2 according to some embodiments of the present invention.

Referring to FIG. 3, a semiconductor substrate 100 is provided that has defined therein a transistor region "a" and a resistance region "b". A well 101 is formed in the semiconductor substrate 100 of the transistor region "a". A device isolating layer 102 is formed on the semiconductor substrate 100. The device isolating layer 102 defines an active region in the transistor region "a". Additionally, the device isolating layer 102 is formed on the semiconductor substrate 100 of the resistance region "b". The device isolating layer 102 is formed on the entire surface of the resistance region "b". The well 101 may be formed using a first ion implantation process that uses first conductive type dopant ions. After performing the first ion implantation process, a thermal treatment process can be performed to activate the implanted dopant. The device isolating layer 102 may be formed of a trench-type device isolating layer. After forming the well 101, the device isolating layer 102 may be formed. In contrast, the well 101 may be formed after forming the device isolating layer 102.

After forming a gate insulating layer 104 on the active region, a gate conductive layer is formed on the entire surface of the semiconductor substrate 100. The gate conductive layer may be formed of a doped polysilicon. A gate electrode 106g is formed on the transistor region "a" and a resistance pattern 106r is formed on the resistance region "b" by patterning the gate conductive layer. The gate electrode 106g crosses over the active region. The resistance pattern 106r is formed on the device isolating layer 102 of the resistance region "b".

Before patterning the gate conductive layer, a second ion implantation process may be performed to adjust resistivity of the gate conductive layer in the resistance region "b". The second ion implantation process may use one of the first conductive type dopant ions and the second conductive type dopant ions.

Figure 4:
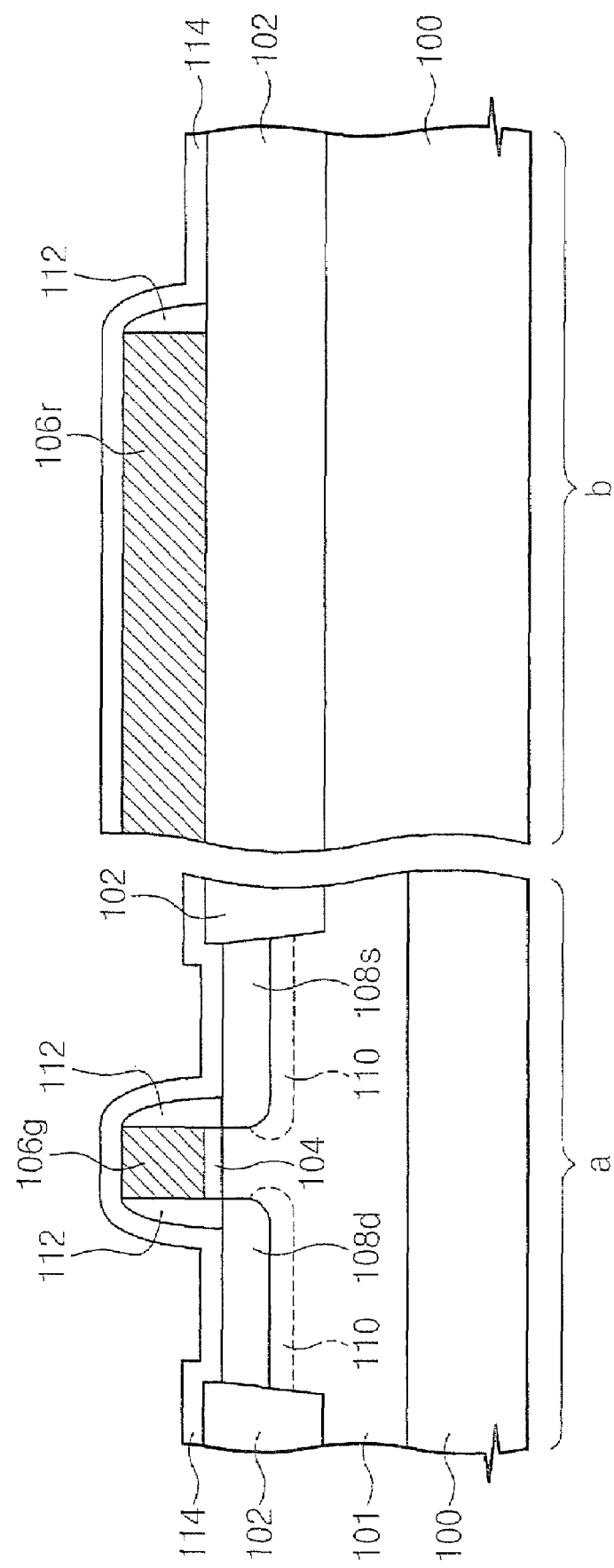

Referring to FIG. 4, a third ion implantation process is performed through second conductive type ions using the gate electrode 106g as a mask, to form a drain region 108d and a source region 108s in the active region on both sides of the gate electrode 106g. A fourth ion implantation process is performed through the first conductive type ions using the gate electrode 106g as a mask to form pocket doped regions 110 in the well 101 below the drain region 108d and the source region 108s. The fourth ion implantation process may be carried out using slant implantation. Therefore, the pocket doped region 110 can cover lower sidewalls of the drain and source regions 108d and 108s adjacent to a channel region below the gate electrode 106g. As described above, the first ion implantation process for the well 101 and the fourth ion implantation process for the pocket doped region 110 may use dopant ions of the same type.

Spacers 112 are respectively formed on both sidewalls of the gate electrode 106g. At this point, the spacer 112 may be formed on the sidewall of the resistance pattern 106r. After forming the spacer 112, a fifth ion implantation process is performed through second conductive type dopant ions by using the gate electrode 106g and the spacer 112 as a mask. Therefore, the drain and source regions 108d and 108s can be formed in a lightly-doped drain (LDD) structure.

A silicide preventing layer 114 is formed on the entire surface of the semiconductor substrate 100. The silicide preventing layer 114 is formed of an insulating material that inhibit/prevents formation of silicide in subsequent processes. The silicide preventing layer 114 may include an insulating material that inhibits/minimizes infiltration of metal atoms. For example, the silicide preventing layer 114 may include a nitride layer. The silicide preventing layer 114 can include a sequentially-stacked oxide and nitride layer.

Figure 5:
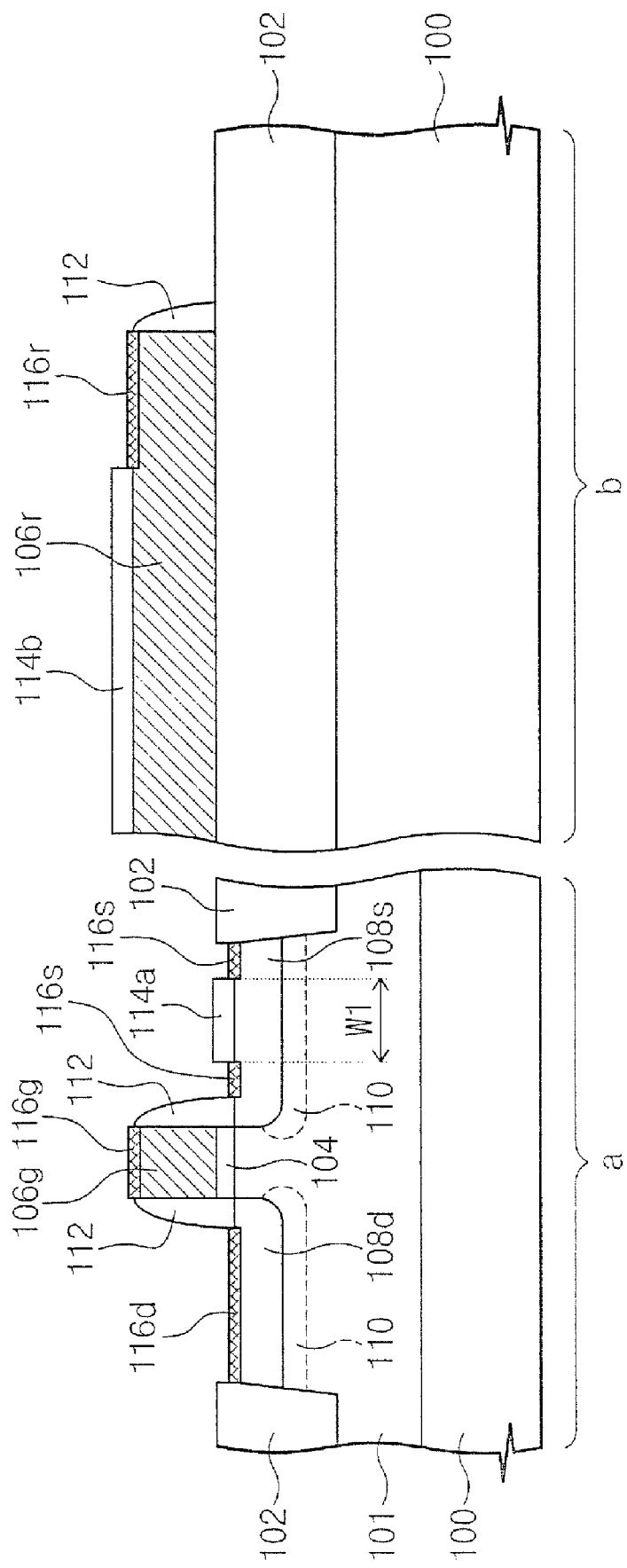

Referring to FIG. 5, a source silicide preventing pattern 114a is formed in the transistor region "a" and a resistance silicide preventing pattern 114b is formed in the resistance region "b" by patterning the silicide preventing layer 114. The source silicide preventing pattern 114a is formed on a portion of the top surface of the source region 108s adjacent to the spacer 112. Another portion of the top surface of the source region 108s is exposed. The source silicide preventing pattern 114a has a first width W1 in a channel length direction of a channel region. The entire top surface of the drain region 108d adjacent to the spacer 127 is exposed. Additionally, the top surface of the gate electrode 106g may be exposed. The resistance silicide preventing pattern 114b covers the resistance pattern 106r. At this point, the top surfaces on both ends of the resistance pattern 106r are exposed. The silicide preventing pattern 114 may be patterned using an anisotropy etch process or an isotropic etch process.

A silicidation process is performed on the semiconductor substrate 100 including the source and resistance silicide preventing patterns 114a and 114b. A metal layer is formed on the entire surface of the semiconductor substrate 100 having the source and resistance silicide preventing patterns 114a and 114b. Next, a thermal treatment process is performed on the semiconductor substrate 100 having the metal layer. Accordingly, a first surface metal silicide 116d, a second surface metal silicide 116s, a gate metal silicide 116g, and a resistance metal silicide 116r are respectively formed when the metal layer reacts to the exposed drain region 108d, the exposed source region 108s, the exposed gate electrode 106g, and the exposed resistance pattern 106r. At this point, a metal silicide is not formed on a portion of the source region 108s which is covered by the source and resistance silicide preventing patterns 114a and 114b and the resistance pattern 106r. The forming of the metal layer and the thermal treatment process can be performed through an ex-situ method or an in-situ method. The metal silicides 116d, 116s, 116g, and 116r can be formed so as to have a sufficient etch selectivity with respect to the semiconductor substrate 100. For example, the metal silicides 116d, 116s, 116g, and 116r may be formed of cobalt silicide. A thermal treatment process then removes the unreacted metal layer.

Figure 6:
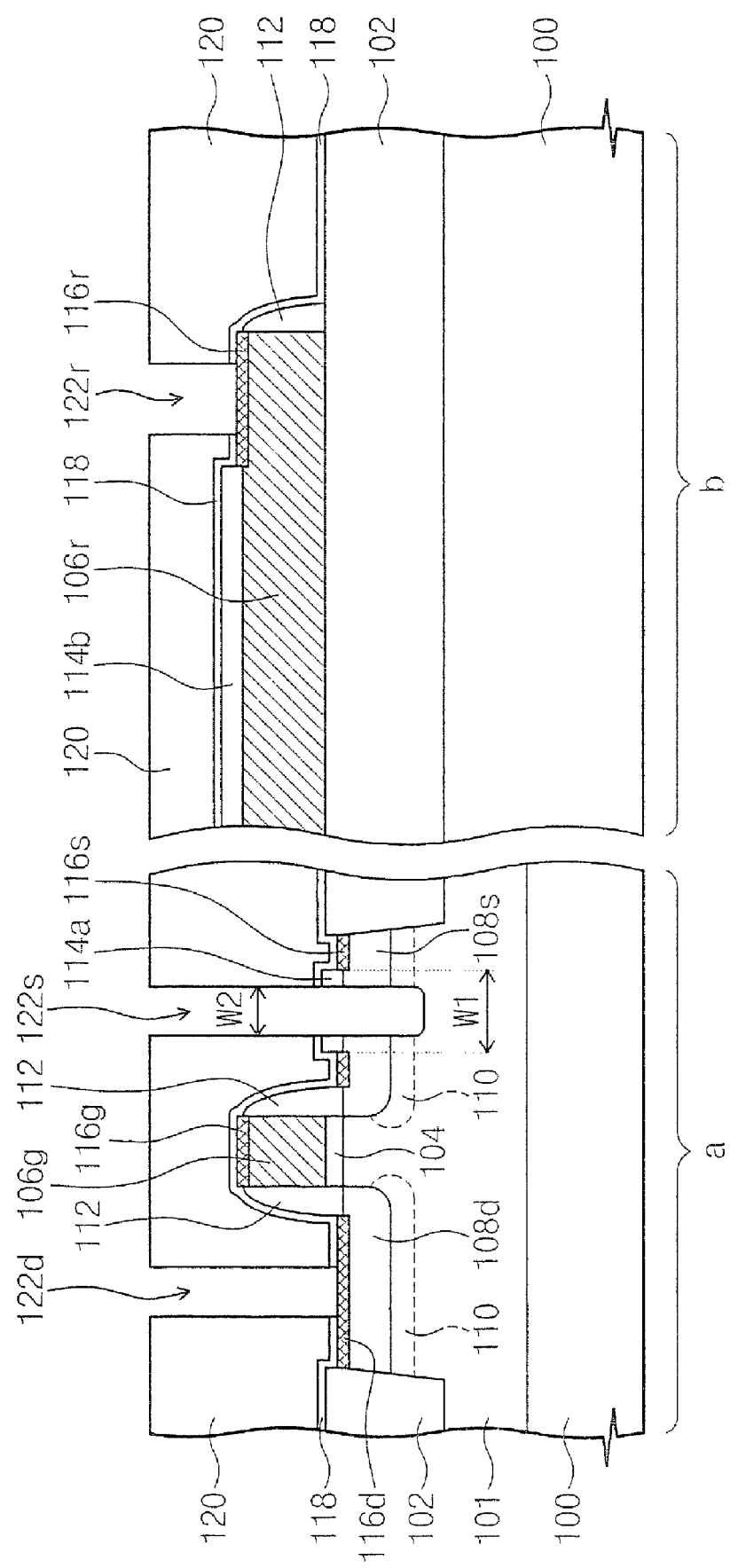

Referring to FIG. 6, an etch stop layer 118 and an interlayer dielectric 120 are sequentially formed on the entire surface of the semiconductor substrate 100 having the metal silicides 116d, 116s, 116g, and 116r. The materials of the etch stop layer 118 and the interlayer dielectric 120 can be the same as those described-above for FIG. 2. The interlayer dielectric 120, the etch stop layer 118, the source silicide preventing pattern 114a, and the semiconductor substrate 100 are successively patterned to form a first contact hole 122d, a second contact hole 122s, and a resistance contact hole 122r. The first contact hole 122d passes through the interlayer dielectric 120 and the etch stop layer 118 to expose the first surface metal silicide 116d. The second contact hole 122s passes through the interlayer dielectric 120, the etch stop layer 118, the source silicide preventing pattern 114a, and the source region 108s. Therefore, the second contact hole 122s exposes the source region 108s and the well 101. The second contact hole 122s exposes the pocket doped region 110 in the well 101 below the source region 108s. A second width W2 in the channel length direction of the second contact hole 122s is less than a first width W1 of the source silicide preventing pattern 114a. Accordingly, the second contact hole 122s passes through the source silicide preventing pattern 114a, and also the source silicide preventing pattern 114a surrounds the second contact hole 122s. The resistance contact hole 122r passes through the interlayer dielectric 120 and the etch stop layer 118 to expose the resistance metal silicide 116r.

The etch stop layer 118 serves as an etch stop layer when etching the interlayer dielectric 120 to form the contact holes 122d, 122s, and 122r.

As described above, the first surface metal silicide 116d and the resistance metal silicide 116r have a sufficient etch selectivity with respect to the semiconductor substrate 100. Accordingly, the first surface metal silicide 116d and the resistance metal silicide 116r serve as an etch stop layer when etching the source region 108s to form the second contact hole 122s. Consequently, when forming of the second contact hole 122s, the semiconductor substrate 100 (i.e., the active region with the drain region 108d) below the first contact hole 122d, and the resistance pattern 106r below the resistance contact hole 122r are protected. The metal silicides 116d, 116s, 116g, and 116r have a sufficient etch selectivity with respect to the source silicide preventing pattern 114a formed of an insulating material.

Next, a conductive layer filling the first and second and resistance contact holes 122d, 122s, and 122r is formed, and is then planarized to form the first and second contact plugs 124d and 124s and the resistance plug 124r of FIG. 2. The interconnections 126d, 126s, and 126r shown in FIG. 2 are then formed, which can complete formation of the semiconductor device shown in FIG. 2.

Accordingly, the first surface metal silicide 116d and the resistance metal silicide 116r serve as an etch stop layer when forming the second contact hole 122s. Additionally, the source silicide preventing pattern 114a causes formation of the second surface metal silicide 116s only in a region surrounding where the second contact hole 122s is formed. Accordingly, the semiconductor substrate 100 below the first contact hole 122d and the resistance contact hole 122r, and also the resistance pattern 106r can be protected, such that the second contact hole 122s can be formed.

Various other embodiments will now be described, which can be identical to the earlier embodiments except that a source region and a contact plug are connected to a well below the source region. Like reference numerals refer to like elements. For the sake of brevity, the distinctive characteristics of these other embodiment are primarily described below.

Figure 7:
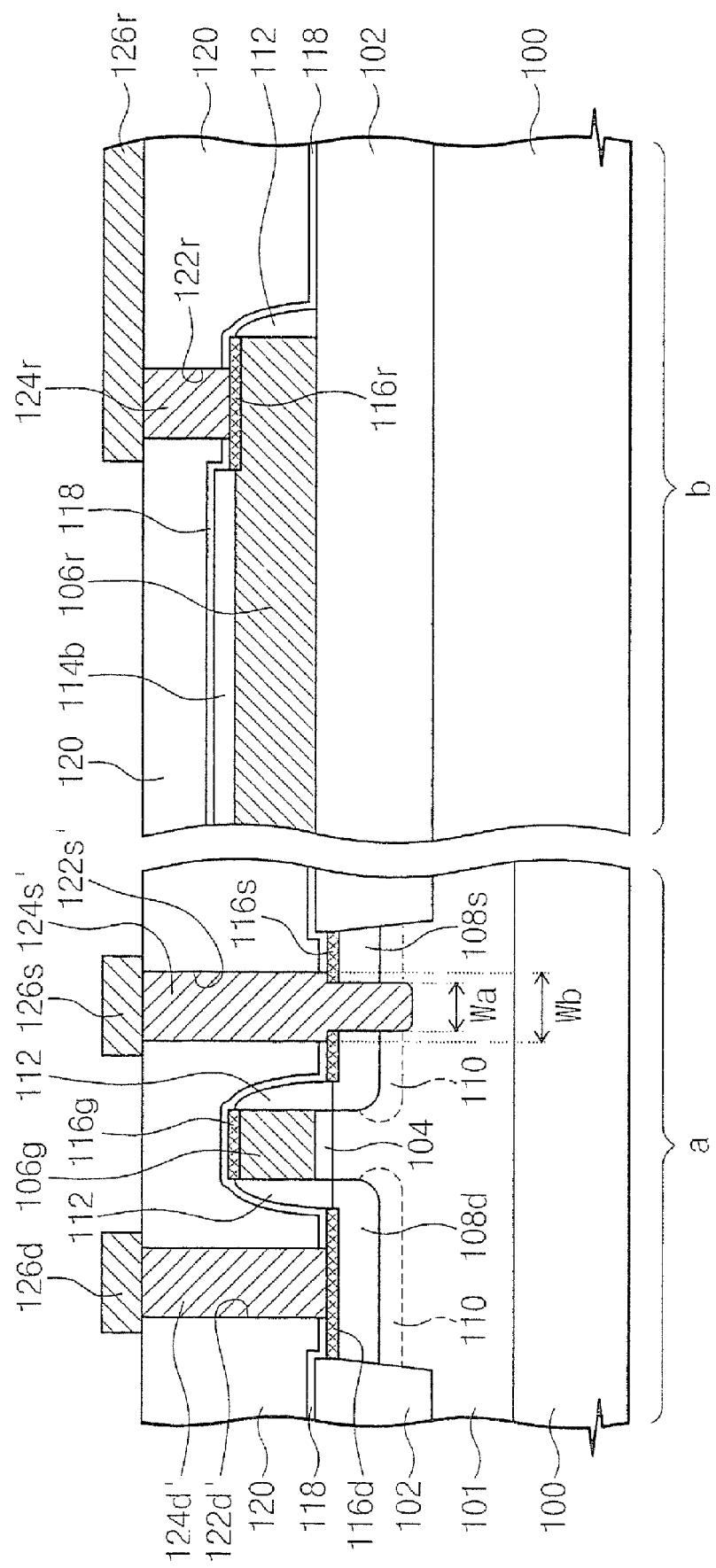
FIG. 7 is a sectional view of a semiconductor device according to some other embodiments of the present invention.

FIG. 7 is a sectional view of a semiconductor device according to some other embodiments of the present invention.

Referring to FIG. 7, a gate insulating layer 104 and a gate electrode 106g are sequentially stacked on an active region of a transistor region "a". A drain region 108d and a source region 108s are disposed in the active region on opposite sides of the gate electrode 106g. Spacers 112 are on opposite sidewalls of the gate electrode 106g. A first surface metal silicide 116d is disposed on the entire top surface of the drain region 108d adjacent to the spacer 112, and a second surface metal silicide 116s is disposed on a portion of the top surface of the source region 108s adjacent to the spacer 112. Accordingly, the top surface of the source region 108s adjacent to the spacer 112 is divided into a region where the second surface metal silicide 116s is present and a region where the second surface metal silicide 116s is absent.

An etch stop layer 118 and an interlayer dielectric 120 sequentially cover the entire surface of the semiconductor substrate 100. A first contact plug 124d' successively passes through the interlayer dielectric 120 and the etch stop layer 118 to contact the first surface metal silicide 116d. The second contact plug 124s' successively passes through the interlayer dielectric 120, the etch stop layer 118, and the source region 108s. The second contact plug 124s' passes through a region where the second surface metal silicide 116s is absent and through the source region 108s. The region where the second surface metal silicide 116a is absent has a first width Wa in a channel length direction of a channel region below the gate electrode 106g. The second contact plug 124s' contacts the source region 108s and the well 101 below the source region 108s. The second contact plug 124s' contacts a pocket doped region 110 formed on the well 101 below the source region 108s, such that a contact resistance between the second contact plug 124s' and the well 101 is reduced. The first and second contact plugs 124d' and 124s' respectively fill the first and second contact holes 122d' and 122s'. The first contact hole 122d' passes through the interlayer dielectric 120 and the etch stop layer 118 to expose the first surface metal silicide 116d. The second contact hole 122s' passes through the etch stop layer 118 and the source region 108s.

The second contact plug 124s' includes a first portion passing through the interlayer dielectric 120 and the etch stop layer 118, and a second portion passing through the source region 108s. The first portion of the second contact plug 124s' has a second width Wb in the channel length direction, and a second portion of the second contact plug 124s' has the first width Wa in the channel length direction. The first width Wa is less than the second width Wb. Accordingly, the second surface metal silicide 116s contacts the contact plug 124s' at a location that separates the first portion from the second portion of the second contact plug 124s'. A width of a lower portion of the second region of the second contact plug 124s' may have the same as, or smaller than, the first width Wa. The width in the channel length direction of the first contact plug 124d' may be identical to the second width Wb. Alternatively, the width of the first contact plug 124d' can be different from the second width Wb.

The first and second interconnections 126d and 126s are disposed on the interlayer dielectric 120 and respectively contact the first and second contact plugs 124d' and 124s'. Other illustrated components, such as the resistance pattern 106r in the resistance region "b" of the semiconductor substrate 100, can be the same as those described above for the same reference numbers in FIG. 2.

As shown in FIG. 7, the second contact plug 124s' contacts the second surface metal silicide 116s. Consequently, contact resistance between the second contact plug 124s' and the source region 108s may be reduced, and a bias voltage level applied thereto may be more precisely regulated.

Further methods of forming a semiconductor device, such as the semiconductor device of FIG. 7, are described below with reference to FIGS. 8 and 9 in accordance with some embodiments of the present invention, and can include the methods described above for FIGS. 3 and 4.

Referring to FIGS. 4 and 8, by patterning the silicide preventing layer 114, a source silicide preventing pattern 114a' is formed in the transistor region "a", and also a resistance silicide preventing pattern 114b is formed in the resistance region "b". The source silicide preventing patter 114a' has a first width Wa in a channel length direction of a channel region below the gate electrode 106g.

An etch stop layer 118 and an interlayer dielectric 120 are sequentially formed on the semiconductor substrate 100. By patterning the interlayer dielectric 120 and the etch stop layer 118, a first contact hole 122d', an upper hole 150, and a resistance contact hole 122r are formed. The first contact hole 122d' exposes the first surface metal silicide 116d. The upper hole 150 is formed on the source region 108s. The upper hole 150 has a second width Wb in the channel length direction. The second width Wb is greater than the first width Wa. Accordingly, the upper hole 150 can expose us the entire source silicide preventing pattern 114a'. Additionally, the upper hole 150 exposes the second surface metal silicide 116s around the source silicide preventing pattern 114a'.

Referring to FIG. 9, the source silicide preventing pattern 114a' and the source region 108s exposed by the upper hole 150 are successively etched to form a lower hole 151. At this point, all the source silicide preventing pattern 114a' is removed, and the lower hole 151 passes through the source region 108s and the pocket doped region 110 below the source silicide preventing pattern 114a'. Therefore, a sidewall of the lower hole 151 exposes a portion of the source region 108s and of the pocket doped region 110 in the well 101.

As described above, the first and second surface metal silicides 116d and 116s and the resistance metal silicide 116r are configured to have a sufficient etch selectivity with respect to the semiconductor substrate 100. Accordingly, when forming the lower hole 151, the first surface metal silicide 116d exposed to the first contact hole 122d', the second surface metal silicide 116s exposed to the upper hole 150, and the resistance metal silicide 116r exposed to the resistance contact hole 122r function sufficiently as an etch stop layer, which can protect the drain region 108d and the resistance pattern 106r. Therefore, the width of the channel length direction in at least an upper portion of the lower hole 151 has the first width Wa, which is less than the second width Wb. Accordingly, at least a portion of the lower hole 151 within the source region 108s is more narrow than a portion of the upper hole exposing the second surface metal silicide 116s and/or adjacent to an upper surface of the interlayer dielectric 120.

Formation of the first contact hole 122d', the upper hole 150, and the resistance contact hole 122r and formation of the lower hole 151 may be sequentially performed through the same mask pattern (not shown). As shown in FIG. 9, the second contact hole 122s' includes the upper hole 150 and the lower hole 151.

Next, a conductive layer is formed on the entire surface of the semiconductor substrate 100 to fill the first and second contact holes 122d' and 122s' and the resistance contact hole 122r, and it's been planarized to expose the interlayer dielectric 120, and form therefrom the first contact plug 124d', the second contact plug 124s', and the resistance plug 124r of FIG. 7.

Next, the first interconnection 126d, the second interconnection 126s, and the resistance interconnection 126r of FIG. 7 are formed as shown in FIG. 7.

The exemplary transistor may be formed in a peripheral circuit region. Alternatively, the exemplary transistor can be formed in a unit cell of a SRAM device. For example, the exemplary transistor may configured as a driver transistor, i.e., an NMOS transistor in a SRAM cell, and/or as a pull-up transistor, i.e., a PMOS transistor in the SRAM cell. Furthermore, the exemplary transistor may be more generally utilized in any type of semiconductor devices which include transistors.

As explained, some embodiments of the present invention provide a contact plug that passes through a source region to contact a well below the source region. The contact plug can pass through an opening in a surface metal silicide layer on the top surface of the source region. Accordingly, a bias voltage level can be directly applied through the contact plug to the source region and to a well that is below the source region. Application of the bias voltage level in this manner may improve operational stability of the transistor. Use of the contact plug may eliminate the need to form a conventional well pickup region, and may enable formation of a more highly integrated semiconductor transistor and associated device.

The above-disclosed subject matter is to be considered illustrative, and not restrictive, and the appended claims are intended to cover all such modifications, enhancements, and other embodiments, which fall within the spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
    a first doped region and a second doped region, both doped with dopants, spaced apart from each other, and defined within a same well of a semiconductor substrate;
    a gate insulating layer and a gate electrode stacked on a channel region between the first and second doped regions;
    spacers on opposite sidewalls of the gate electrode;
    a first surface metal silicide layer that extends across a top surface of the first doped region adjacent to the spacer;
    a second surface metal silicide layer that extends across a top surface of the second doped region adjacent to the spacer;
    at least one insulation layer that extends across the semiconductor substrate including the first and second surface metal silicide layers;
    a first contact plug that extends through the insulation layer and contacts the first surface metal silicide layer; and
    a second contact plug that extends through the insulation layer, the second surface metal silicide layer, and the second doped region into the well in the semiconductor substrate.

2. The semiconductor device of claim 1, further comprising a silicide preventing pattern on the semiconductor substrate and that separates the second contact plug from the second surface metal silicide layer.

3. The semiconductor device of claim 1, wherein:
    the second contact plug comprises a first portion that extends through the insulation layer, and a second portion that extends through the second doped region; and
    the first portion of the second contact plug is wider than the second portion of the second contact plug.

4. The semiconductor device of claim 1, further comprising a pair of pocket doped regions defined in the well respectively below the first and second doped regions, wherein the pocket doped regions have a higher dopant concentration of the same type of dopant as that doped in the well, and
    wherein the second contact plug extends at least partially into the pocket doped region below the second doped region.

5. The semiconductor device of claim 1, wherein the well is doped with a p-type dopant and the first and second doped regions are doped with an n-type dopant, and, during operation, the semiconductor device is configured to apply, a ground voltage to the well and to the second doped region through the second contact plug.

6. The semiconductor device of claim 1, wherein the well is doped with an n-type dopant and the first and second doped regions are doped with a p-type dopant, and, during operation, the semiconductor device is configured to apply a power voltage to the well and to the second doped region through the second contact plug.

7. The semiconductor device of claim 1, further comprising a gate metal silicide on the gate electrode, wherein the gate metal silicide and the first and second surface metal silicide layers comprise the same metal.

8. The semiconductor device of claim 1, wherein the semiconductor substrate comprises a transistor region and a resistance region, and the well, the first doped region, the second doped region, and the gate electrode are disposed in the transistor region,
    the semiconductor device further comprising:
    a resistance pattern on the semiconductor substrate in the resistance region;
    a resistance silicide preventing pattern on a first portion of a top surface of the resistance pattern;
    a resistance metal silicide layer on a second portion of the top surface of the resistance pattern and not on the first portion of the top surface of the resistance region; and
    a resistance plug that extends through the insulation layer to contact the resistance metal silicide layer.

9. The semiconductor device of claim 8, wherein the resistance metal silicide layer and the first and second surface metal silicide layers comprise the same metal.

10. The semiconductor device of claim 8, wherein the resistance plug and the first and second contact plugs comprise the same material.

11. The semiconductor device of claim 8, further comprising:

a first interconnection on the insulation layer and that contacts the first contact plug;

a second interconnection on the insulation layer and that contacts the second contact plug; and a resistance interconnection on the insulation layer and that contacts the resistance plug.

* * * * *